(12) United States Patent
Ishikawa et al.

(10) Patent No.: US 9,082,973 B2
(45) Date of Patent: Jul. 14, 2015

(54) RESISTANCE RANDOM ACCESS MEMORY DEVICE

(71) Applicant: Kabushiki Kaisha Toshiba, Minato-ku (JP)

(72) Inventors: Takayuki Ishikawa, Kanagawa-ken (JP); Shosuke Fujii, Kanagawa-ken (JP); Hidenori Miyagawa, Kanagawa-ken (JP); Hiroki Tanaka, Kanagawa-ken (JP); Masumi Saitoh, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 108 days.

(21) Appl. No.: 14/022,732

(22) Filed: Sep. 10, 2013

(65) Prior Publication Data

US 2014/0284543 A1 Sep. 25, 2014

Related U.S. Application Data

(60) Provisional application No. 61/803,211, filed on Mar. 19, 2013.

(51) Int. Cl.
*H01L 47/00* (2006.01)
*H01L 45/00* (2006.01)
*H01L 27/24* (2006.01)

(52) U.S. Cl.
CPC .......... *H01L 45/148* (2013.01); *H01L 27/2436* (2013.01); *H01L 27/2481* (2013.01); *H01L 45/085* (2013.01); *H01L 45/1233* (2013.01); *H01L 45/1266* (2013.01)

(58) Field of Classification Search
CPC ............ H01L 21/30604; H01L 21/308; H01L 21/76224; H01L 21/764; H01L 21/76802; H01L 21/76814; H01L 21/76843; H01L 21/76877; H01L 23/3677; H01L 23/373; H01L 29/66242
USPC .......................... 257/2–4, E45.006, E47.001; 438/102–104
See application file for complete search history.

(56) References Cited

U.S. PATENT DOCUMENTS

| 2011/0049465 A1 | 3/2011 | Nagashima |
| 2011/0240949 A1 | 10/2011 | Mitani et al. |
| 2012/0205608 A1 | 8/2012 | Yamauchi et al. |

(Continued)

FOREIGN PATENT DOCUMENTS

| TW | 200824097 A1 | 6/2008 |
| WO | WO 2012/111205 A1 | 8/2012 |
| WO | WO 2012/165018 A1 | 12/2012 |

OTHER PUBLICATIONS

U.S. Appl. No. 13/970,169, filed Aug. 19, 2013, Hidenori Miyagawa, et al.

(Continued)

*Primary Examiner* — Mark A Laurenzi
(74) *Attorney, Agent, or Firm* — Oblon, McClelland, Maier & Neustadt, L.L.P.

(57) ABSTRACT

A resistance random access memory device according to an embodiment includes a first electrode, a second electrode, and a variable resistance portion placed between the first electrode and the second electrode. The variable resistance portion includes a first insulating layer, a second insulating layer, and a crystal layer that is placed between the first insulating layer and the second insulating layer, has a higher resistivity than the first electrode, and is crystalline.

18 Claims, 13 Drawing Sheets

(56) References Cited

U.S. PATENT DOCUMENTS

| | | |
|---|---|---|
| 2012/0292586 A1 | 11/2012 | Yamauchi et al. |
| 2012/0319074 A1 | 12/2012 | Fujii et al. |
| 2012/0319077 A1 | 12/2012 | Yasuda et al. |

OTHER PUBLICATIONS

U.S. Appl. No. 13/825,688, filed May 16, 2013, Shosuke Fujii, et al.
U.S. Appl. No. 13/603,718, filed Sep. 5, 2012, Shosuke Fujii, et al.
U.S. Appl. No. 13/955,546, filed Jul. 31, 2013, Shosuke Fujii, et al.
U.S. Appl. No. 13/949,535, filed Jul. 24, 2013, Masumi Saitoh, et al.
U.S. Appl. No. 13/714,946, filed Dec. 14, 2012, Takayuki Ishikawa, et al.
U.S. Appl. No. 13/716,347, filed Dec. 17, 2012, Shosuke Fujii, et al.
U.S. Appl. No. 14/022,798, filed Sep. 10, 2013, Miyagawa etla.
U.S. Appl. No. 14/022,732, filed Sep. 10, 2013, Ishikawa et al.
Office Action for Taiwanese patent application No. 102129352 issued Apr. 9, 2015 (with English Translation).

LOW RESISTANCE STATE

HIGH RESISTANCE STATE

LOW RESISTANCE STATE

HIGH RESISTANCE STATE

UNDER APPLICATION OF WRITE VOLTAGE

AFTER TURNING OFF WRITE VOLTAGE

RESISTANCE RANDOM ACCESS MEMORY DEVICE

CROSS-REFERENCE TO RELATED APPLICATIONS

This application is based upon and claims the benefit of priority from U.S. Provisional Patent Application 61/803,211, filed on Mar. 19, 2013; the entire contents of which are incorporated herein by reference.

FIELD

Embodiments described herein relate generally to a resistance random access memory device.

BACKGROUND

The resistance random access memory device (ReRAM) is a nonvolatile memory device in which the memory element has a two-terminal structure including a variable resistance layer sandwiched between two electrodes. The resistance random access memory device has a simpler cell structure than other memory devices, and hence is considered to be easily scaled. Thus, the resistance random access memory device is drawing attention as a promising candidate for the next-generation high-capacity memory device for replacing existing products, such as NAND flash memories, widely commercialized as high-capacity memory devices.

As the variable resistance material constituting the variable resistance layer of the resistance random access memory device, various materials are investigated, such as transition metal oxide materials, sulfide materials, perovskite oxide materials, semiconductor materials, and so on. Among them, the resistance random access memory device with the material of the variable resistance layer being a semiconductor material such as amorphous silicon has high compatibility with the CMOS process, and hence is promising for commercialization. However, such a resistance random access memory device with the variable resistance layer formed from a semiconductor material has the problem of insufficient retention performance in the write state, i.e., the low resistance state.

BRIEF DESCRIPTION OF THE DRAWINGS

FIG. 8A shows the device under application of a write voltage and FIG. 8B shows the device after turn-off of the write voltage;

DETAILED DESCRIPTION

A resistance random access memory device according to an embodiment includes a first electrode, a second electrode, and a variable resistance portion placed between the first electrode and the second electrode. The variable resistance portion includes a first insulating layer, a second insulating layer, and a crystal layer that is placed between the first insulating layer and the second insulating layer, has a higher resistivity than the first electrode, and is crystalline.

Embodiments of the invention will now be described with reference to the drawings.
(First Embodiment)

First, a first embodiment is described.

Figure 1:
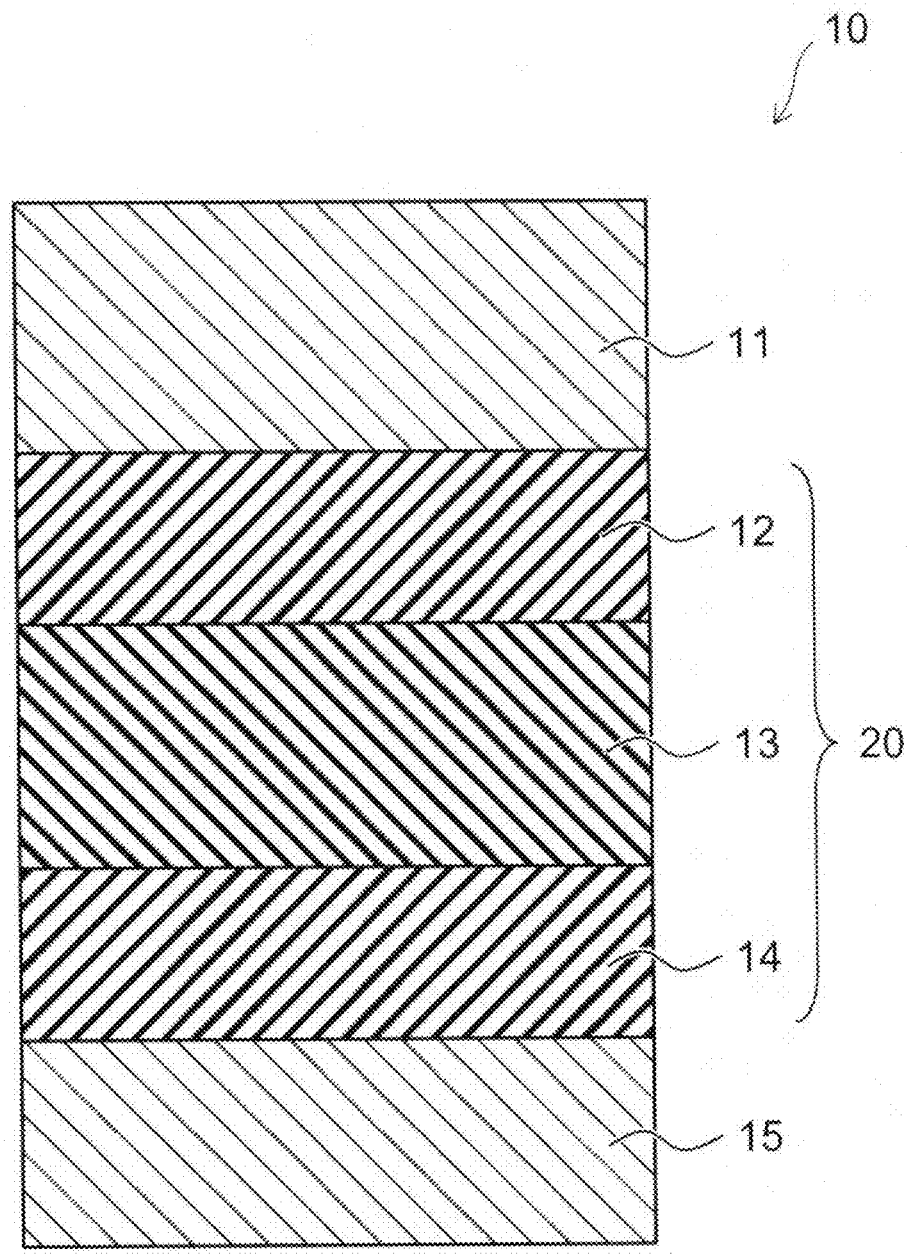
FIG. 1 is a sectional view illustrating a memory element of a resistance random access memory device according to a first embodiment.

FIG. 1 is a sectional view illustrating a memory element of a resistance random access memory device according to the embodiment.

As shown in FIG. 1, in the memory element 10 of the resistance random access memory device according to the embodiment, an electrode 11, an insulating layer 12, a crystal layer 13, an insulating layer 14, and an electrode 15 are stacked in this order. A variable resistance portion 20 is formed from the insulating layer 12, the crystal layer 13, and the insulating layer 14.

The electrode 11 is a conductive metal for supplying ions to the variable resistance portion 20. To this end, the material of the electrode 11 is based on an easily ionizable metal. For instance, the material of the electrode 11 can be based on one or more metals selected from the group consisting of silver (Ag), copper (Cu), cobalt (Co), nickel (Ni), aluminum (Al), titanium (Ti), and gold (Au).

The material of the insulating layer 12 and the material of the insulating layer 14 are based on an insulating material that does not substantially react with cations of metal atoms constituting the electrode 11. These materials can be based on e.g. one or more insulating materials selected from the group consisting of silicon oxide, silicon nitride, silicon oxynitride, and metal oxide. The metal oxide can be based on e.g. one or more materials selected from the group consisting of hafnium oxide, aluminum oxide, titanium oxide, tantalum oxide, nickel oxide, tungsten oxide, and vanadium oxide. The material of the insulating layer 12 and the material of the insulating layer 14 may be either identical or different. Each film thickness of the insulating layer 12 and the insulating layer 14 is e.g. 1-5 nm. The film thickness of the insulating layer 12 and the film thickness of the insulating layer 14 may be either identical or different.

The material of the crystal layer 13 is based on a material being crystalline and having a higher resistivity than the electrode 11. It is important for the crystal layer 13 to be crystalline, and the crystal layer 13 may be either polycrystalline or single-crystalline. The material of the crystal layer 13 can be based on e.g. a crystalline semiconductor material such as crystalline silicon (Si), crystalline germanium (Ge), or crystalline silicon germanium (SiGe). However, even in the case where the material of the crystal layer 13 is based on a semiconductor material, there is no need to consciously add impurity. The film thickness of the crystal layer 13 is preferably thicker than each film thickness of the insulating layer 12 and the insulating layer 14. Preferably, the film thickness of the crystal layer 13 is e.g. approximately 2-100 nm.

The material of the electrode 15 is based on a conductor less ionizable than the material of the electrode 11. The material of the electrode 15 can be based on e.g. a semiconductor material containing impurity at high concentration, or a less ionizable, inert metal. The material of the electrode 15 can be based on e.g. a semiconductor material such as silicon (Si), germanium (Ge), or silicon germanium (SiGe) doped with impurity at high concentration, or a less ionizable, inert metal such as platinum (Pt), tungsten (W), molybdenum (Mo), titanium nitride (TiN), or tantalum (Ta).

Next, the operation of the resistance random access memory device according to the embodiment is described.

The memory element 10 in the embodiment is a resistance change memory element in which the resistance value of the variable resistance portion 20 is changed by application of voltage. The memory element 10 is a bipolar element in which the direction of voltage applied at write time and the direction of voltage applied at erase time are opposite to each other.

Specifically, to the variable resistance portion 20 in the high resistance state, a voltage with the electrode 11 being relative positive and the electrode 15 being relatively negative (hereinafter referred to as "forward voltage") is applied. Then, part of the metal atoms constituting the electrode 11 are ionized into cations and migrate toward the electrode 15. In the variable resistance portion 20, the cations are combined with electrons supplied from the electrode 15, and precipitated as metal atoms. Thus, a filament 21 (see FIG. 2A) is formed in the variable resistance portion 20. This results in decreasing the resistance of the variable resistance portion 20, and the memory element 10 transitions to the low resistance state.

On the other hand, to the variable resistance portion 20 in the low resistance state, a voltage with the electrode 11 being relative negative and the electrode 15 being relatively positive (hereinafter referred to as "reverse voltage") is applied. Then, at least part of the metal atoms constituting the filament 21 are ionized into cations and migrate toward the electrode 11. Thus, at least part of the filament 21 disappears. This results in increasing the resistance of the variable resistance portion 20, and the memory element 10 transitions to the high resistance state.

Thus, the low resistance state can be used to define the state in which the value "1" is written, and the high resistance state can be used to define the state in which the value "1" is erased and turned to value "0". Then, by applying a write voltage of the forward voltage, the value "1" is written to the memory element 10. By applying an erase voltage of the reverse voltage, the value "1" is erased from the memory element 10.

Furthermore, by applying a read voltage with the absolute value of the voltage lower than the write voltage and the erase voltage, a current can be passed in the variable resistance portion 20 to detect the resistance value of the variable resistance portion 20. Thus, the value stored in the memory element 10 can be read. The read voltage may be either the forward voltage or the reverse voltage.

The memory device according to the embodiment is remarkably superior in retention performance as illustrated later in the first test example. The memory device according to the embodiment has approximately $10^5$ times longer retention time than the memory device in which the variable resistance portion is formed from amorphous silicon.

Next, the mechanism of the good retention performance realized in the embodiment is described.

The mechanism of enabling the memory device according to the embodiment to realize good retention performance has not been completely elucidated. However, the retention performance of the low resistance state (write state) is determined by the stability of the filament 21 generated in the variable resistance portion 20. Thus, forming a stabler and tougher filament 21 leads to improvement in retention performance. Accordingly, in the memory element 10 of the embodiment, it is inferred that a tough filament 21 is formed in the variable resistance portion 20. Thus, for instance, the following two mechanisms are conjectured.

Figure 2A:
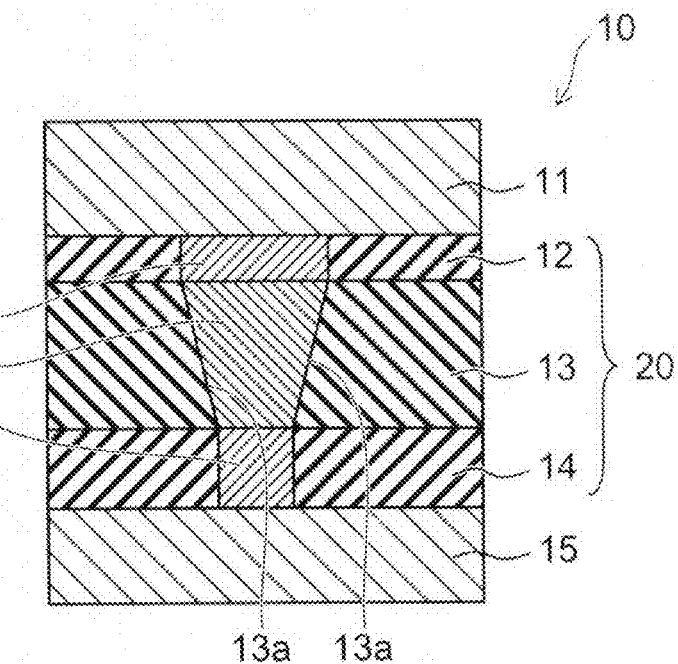
FIGS. 2A and 2B are schematic sectional views showing one conjectured mechanism for the operation of the memory device according to the first embodiment.
Figure 2B:
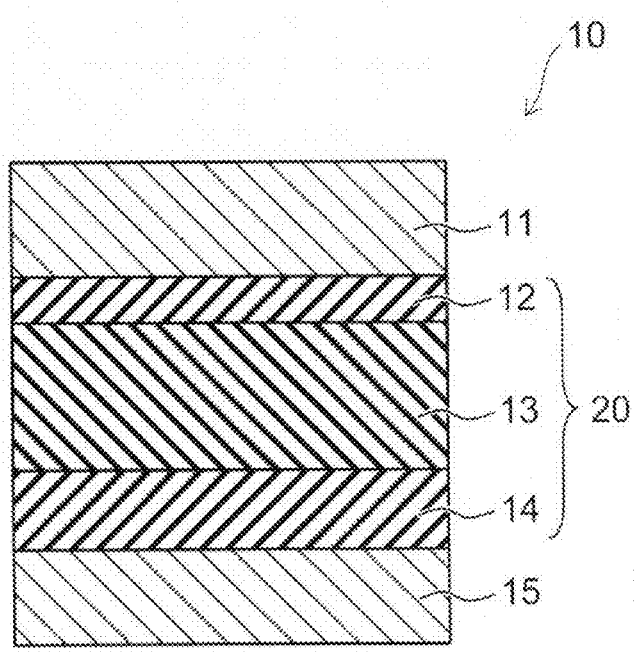

FIGS. 2A and 2B are schematic sectional views showing one conjectured mechanism for the operation of the memory device according to the embodiment.

As shown in FIG. 2A, when a write voltage of the forward voltage is applied to the memory element 10 in the high resistance state, an electric field is formed between the electrode 11 and the electrode 15. Thus, metal atoms forming the electrode 11 are ionized into cations and migrate toward the electrode 15. However, due to nonuniformity in the thickness of the insulating layer 12, the electric field is also made nonuniform. Thus, in the insulating layer 12, the electric field concentrates on the portion having a thinner thickness than other portions.

Thus, a filament 21 is formed originating from a portion where the insulating layer 12 is relatively thin and the electric field is relatively strong. In the filament 21, the portion formed in the insulating layer 12 is referred to as portion 21a, the portion formed in the crystal layer 13 is referred to as portion 21b, and the portion formed in the insulating layer 14 is referred to as portion 21c. Among them, the outer surface of the portion 21b is formed along a crystal face 13a of the crystal layer 13. For instance, in the case of the crystal layer 13 made of single-crystalline silicon and the electrode 11 made of silver, the outer surface of the portion 21b of the filament 21 is formed along a (111) face of silicon. Thus, the portion 21b is formed thick. Because the portion 21b is formed thick, the portions 21a and 21c are also formed thick. Thus, the filament 21 is entirely made tough and less likely to disappear by change over time. This results in good retention performance of the low resistance state.

Furthermore, as shown in FIG. 2B, when an erase voltage of the reverse voltage is applied to the memory element 10 in the low resistance state, at least part of the metal atoms constituting the filament 21 are ionized into cations and migrate toward the electrode 11. Thus, at least part of the filament 21 disappears. As a result, the variable resistance portion 20 transitions to the high resistance state.

Thus, according to this mechanism, the outer surface of the portion 21b of the filament 21 is formed along a crystal face 13a of the crystal layer 13. Accordingly, the portion 21b is formed thick. It is conjectured that as a result, the filament 21 is entirely made thick and tough, achieving good retention performance. It is considered that this mechanism is particularly predominant in the case where the crystal layer 13 is made of single-crystal or a large crystal grain and includes at least one crystal face continuously existing between the interface with the insulating layer 12 and the interface with the insulating layer 14.

Figure 3A:
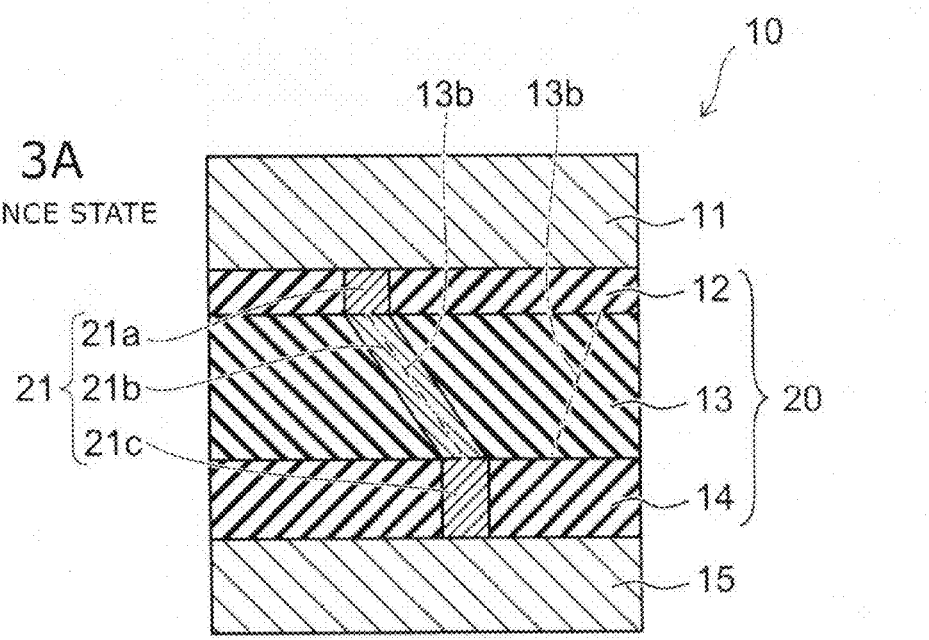
FIGS. 3A and 3B are schematic sectional views showing an alternative conjectured mechanism for the operation of the memory device according to the first embodiment.
Figure 3B:
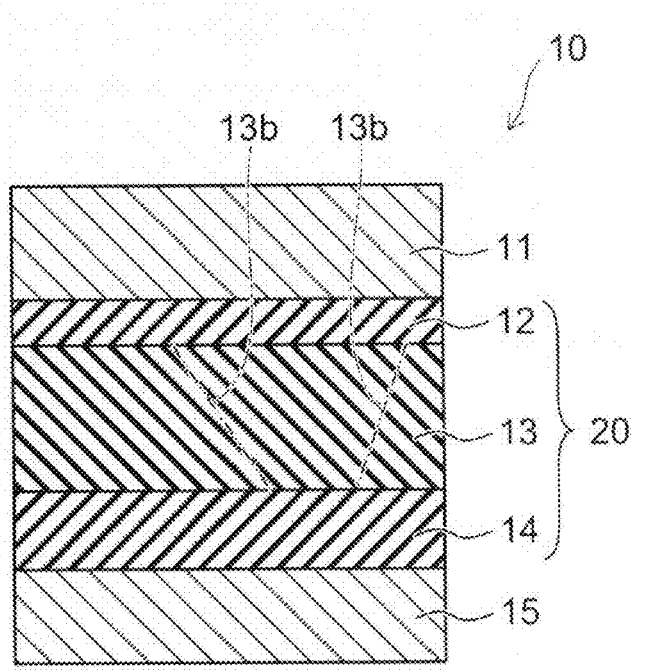

FIGS. 3A and 3B are schematic sectional views showing an alternative conjectured mechanism for the operation of the memory device according to the embodiment.

As shown in FIG. 3A, according to this mechanism, the crystal layer 13 is polycrystalline. The crystal layer 13 includes at least one crystal grain boundary 13b continuously existing between the interface with the insulating layer 12 and the interface with the insulating layer 14. That is, in the crystal layer 13, a crystal grain boundary 13b penetrating in the thickness direction through the crystal layer 13 is formed. In general, the mobility of impurity atoms is higher at a crystal grain boundary than in the crystal grain. Thus, if the portion 21a of the filament 21 is formed in a relatively thin region of the insulating layer 12 where the electric field concentrates, then originating from this portion 21a, the portion 21b is formed along a crystal grain boundary 13b of the crystal layer 13. Furthermore, originating from the portion 21b, the portion 21c is formed in the insulating layer 14. Thus, the portion 21b is stably formed along the crystal grain boundary 13b of the crystal layer 13. Accordingly, an entirely tough filament 21 is formed.

Furthermore, as shown in FIG. 3B, when an erase voltage is applied to the memory element 10, at least part of the metal atoms constituting the filament 21 are ionized into cations and migrate toward the electrode 11. Thus, at least part of the filament 21 disappears. Accordingly, the memory element 10 transitions to the high resistance state.

Thus, according to this mechanism, the portion 21b of the filament 21 is stably formed along a crystal grain boundary 13b of the crystal layer 13. It is conjectured that this stabilizes the entire filament 21 and achieves good retention performance. It is considered that this mechanism is particularly predominant in the case where the crystal layer 13 is polycrystalline and there exists a crystal grain boundary 13b penetrating in the layer thickness direction through the crystal layer 13.

FIRST TEST EXAMPLE

The first test example is a test example showing the effect of the first embodiment.

Figure 4:
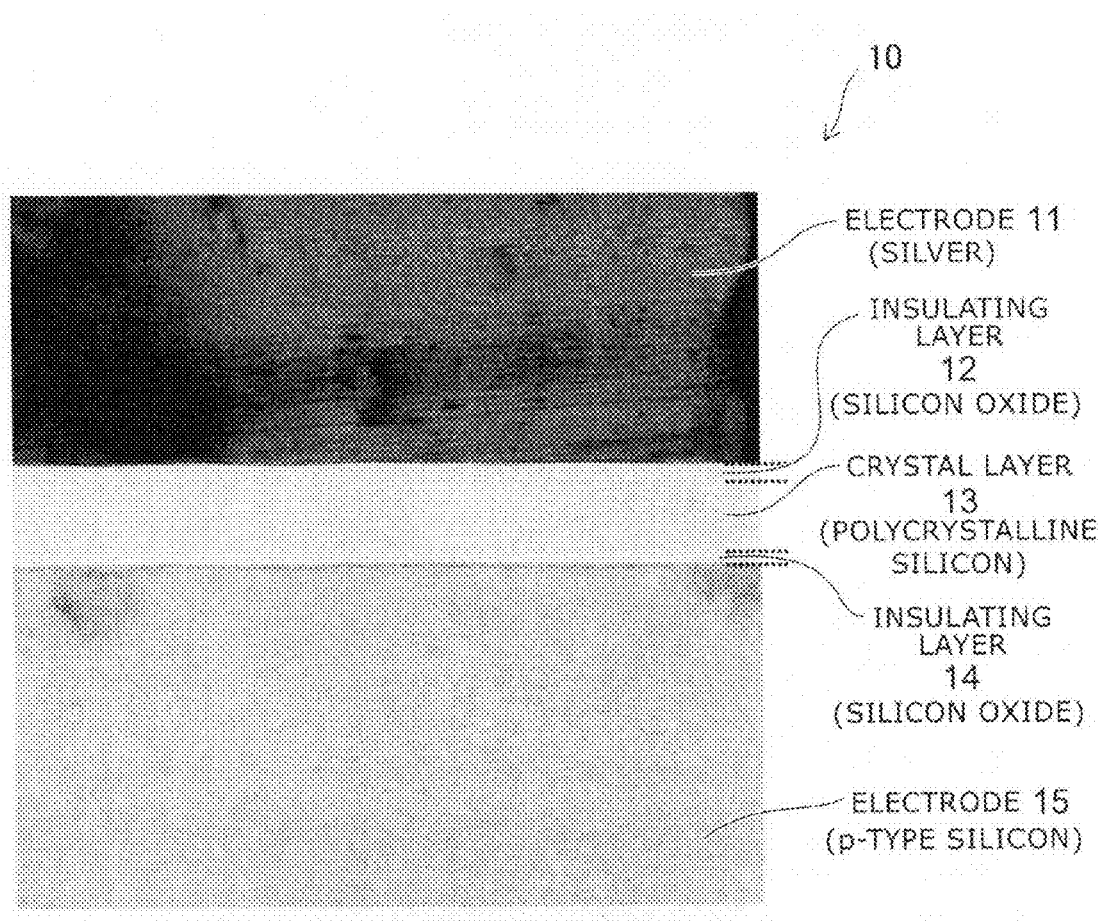
FIG. 4 is a sectional transmission electron micrograph showing the memory element of a first test example.

FIG. 4 is a sectional transmission electron micrograph showing the memory element of this test example.

The sample shown in FIG. 4 was fabricated by the following procedure. On a p-type silicon layer having p-type conductivity, silicon oxide, amorphous silicon, and silicon oxide were deposited in this order. Next, the amorphous silicon was crystallized by heat treatment. Then, silver was deposited.

As shown in FIG. 4, in the memory element of this test example, the amorphous silicon was crystallized and turned polycrystalline. Thus, the memory element was fabricated in which an electrode 11 made of silver, an insulating layer 12 made of silicon oxide, a crystal layer 13 made of polycrystalline silicon, an insulating layer 14 made of silicon oxide, and an electrode 15 made of p-type highly-doped silicon are arranged in this order.

Next, the retention performance of this memory element was evaluated. Specifically, a write voltage was applied to the memory element to cause the variable resistance portion to transition to the low resistance state. Then, with the voltage turned off, the memory element was held at a fixed temperature to measure the read current value with the passage of time. It can be said that a memory element having a longer time before the decrease of the read current value has good retention performance.

Figure 5:
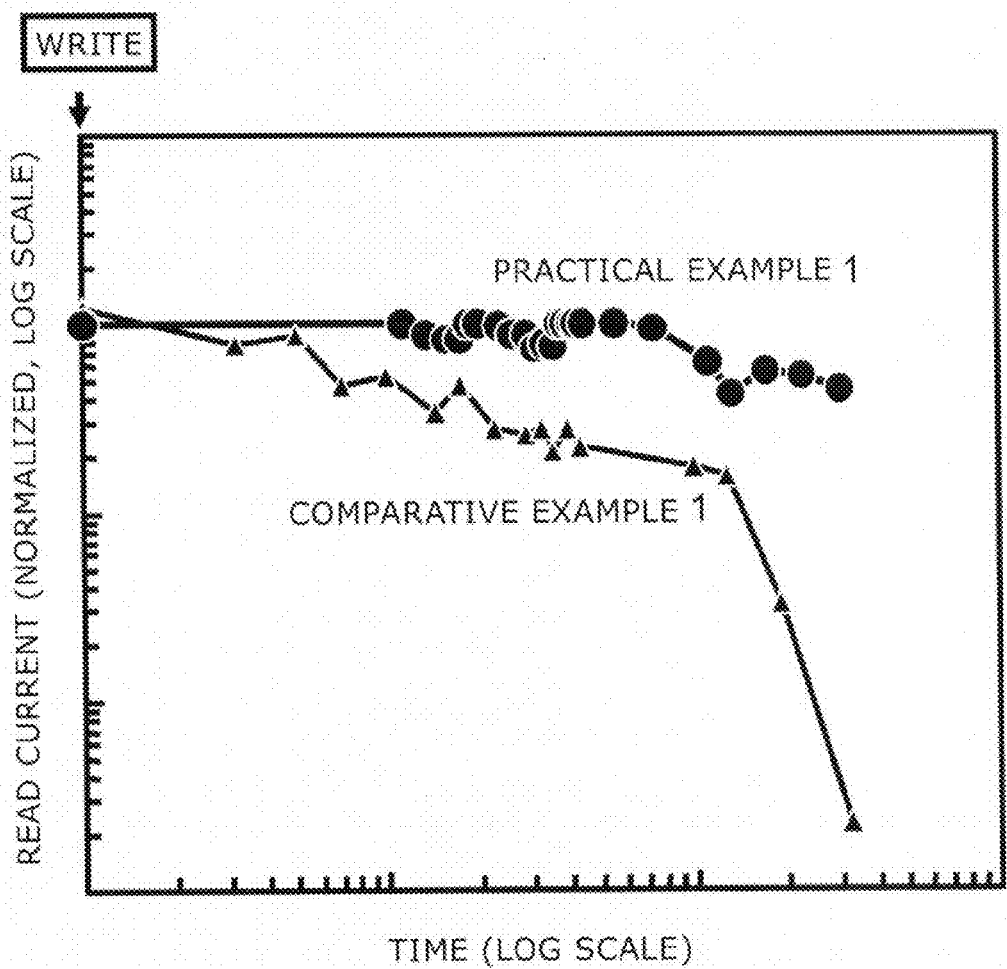
FIGS. 5 and 6 are graphs showing the retention performance of the memory element.
Figure 6:
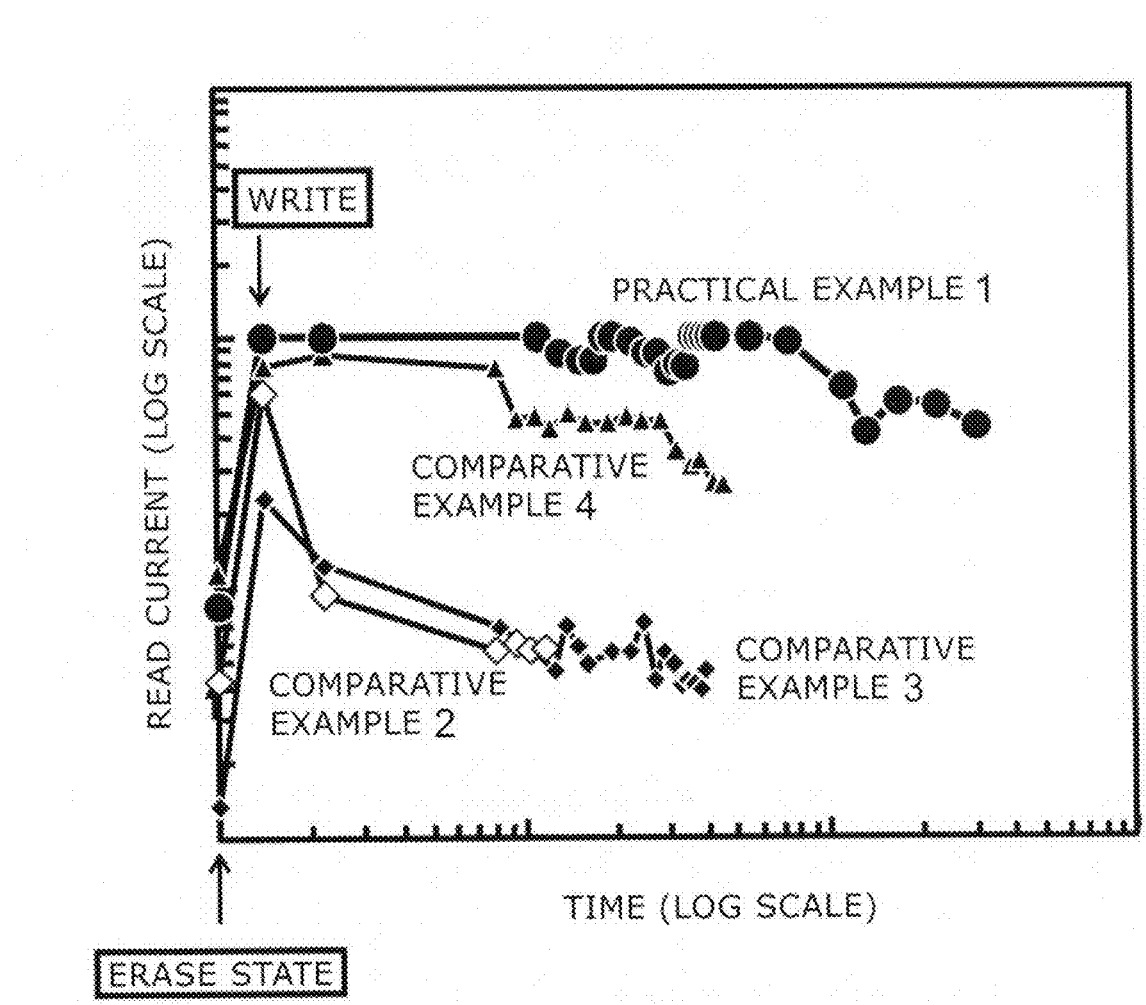

FIGS. 5 and 6 are graphs showing the retention performance of the memory element. The horizontal axis represents time, and the vertical axis represents the value of the read current flowing in the memory element in the low resistance state.

The composition of each layer of each sample shown in FIGS. 5 and 6 is shown in TABLE 1.

TABLE 1

|  | Electrode 11 | Insulating layer 12 | Crystal layer 13 | Insulating layer 14 | Electrode 15 |
| --- | --- | --- | --- | --- | --- |
| Practical example 1 | Silver | Silicon oxide | Crystalline silicon | Silicon oxide | p-type silicon |
| Comparative example 1 | Silver |  | Silicon oxide |  | p-type silicon |
| Comparative example 2 | Silver | Silicon oxide | Amorphous silicon | Silicon oxide | p-type silicon |
| Comparative example 3 | Silver | Silicon oxide | Crystalline silicon | (None) | p-type silicon |
| Comparative example 4 | Silver | (None) | Crystalline silicon | Silicon oxide | p-type silicon |

As shown in TABLE 1, in any of the samples, the electrode 11 serving as an ion source electrode is made of silver, and the electrode 15 serving as an opposite electrode is made of p-type silicon. The samples are different from each other in the layer structure of the variable resistance portion 20.

Practical example 1 is a sample having the same layer structure as the sample shown in FIG. 4. That is, the variable resistance portion 20 is a three-layer film of silicon oxide layer/crystalline silicon layer/silicon oxide layer.

Comparative example 1 is a sample in which the variable resistance portion 20 is entirely formed from a monolayer silicon oxide layer.

In comparative example 2, the crystal layer 13 is formed from amorphous silicon. That is, the variable resistance portion 20 is a three-layer film of silicon oxide layer/amorphous silicon layer/silicon oxide layer.

In comparative example 3, formation of the insulating layer 14 on the electrode 15 (p-type silicon layer) side is omitted. That is, the variable resistance portion 20 has a two-layer structure of silicon oxide layer/crystalline silicon layer.

Comparative example 4 is a sample formed as follows. A silicon oxide layer is formed on the crystal layer 13 (crystalline silicon layer). Then, by wet etching with dilute hydrofluoric acid, the silicon oxide layer is thinned to a negligible thickness. Thus, the insulating layer 12 on the electrode 11 (silver layer) side is substantially removed. That is, the variable resistance portion 20 has a two-layer structure of crystalline silicon layer/silicon oxide layer.

As shown in FIGS. 5 and 6, in the memory element of practical example 1, no significant decrease of read current was observed during the test time. Thus, the memory element of practical example 1 was remarkably superior in retention performance to the memory element of comparative examples 1-4. Practical example 1 had $10^3$-$10^6$ times longer retention time than comparative examples 1-4. Here, the retention time is defined as the time for which the read current value becomes ⅓ times the initial value (at write time).

SECOND TEST EXAMPLE

The second test example is a test example supporting the filament formation mechanism shown in FIGS. 2A and 2B.

The sample of practical example 2 was fabricated by epitaxially growing a crystalline silicon layer on an n-type silicon layer, and forming a silver layer on the crystalline silicon layer. On the upper surface of the crystalline silicon layer, a natural oxide film (silicon oxide layer) was formed. To this sample, a voltage was applied with the silver layer side being positive and the n-type silicon layer side being negative. From a sectional transmission electron micrograph, it was confirmed that one silver filament is formed in the crystalline silicon layer by this process.

It was also confirmed that the interface between the crystalline silicon layer and the silver filament is a (111) face of silicon. Thus, it is conjectured that the stable contact surface of silicon and silver, i.e., the contact surface having a low interface energy, is a (111) face of silicon. It is inferred that formation of a silver filament with the outer surface made of the stable contact surface suppresses aggregation of silver in the crystalline silicon layer, thereby forming a thick and tough filament.

Thus, also in the aforementioned memory device according to the first embodiment, as described with reference to FIGS. 2A and 2B, originating from a relatively thin portion of the insulating layer 12, a tough filament along a crystal face is formed in the crystal layer 13. This filament may extend also into the insulating layer 14 and achieve good retention performance.

On the other hand, also in a sample fabricated by forming a silicon oxide layer on an n-type silicon layer and forming a silver layer on the silicon oxide layer, a similar test was performed. That is, a voltage was applied with the silver layer side being positive and the n-type silicon layer side being negative. Then, a plurality of silver filaments were formed in the silicon oxide layer. However, the aspect of the silver filaments was dissipative, and each silver filament was extremely narrow. Thus, it is considered that as in comparative example 1 described above, in the memory element with the variable resistance portion made of a monolayer silicon oxide layer, filaments were easily decomposed, resulting in low retention performance.

(Second Embodiment)

Next, a second embodiment is described.

Figure 7:
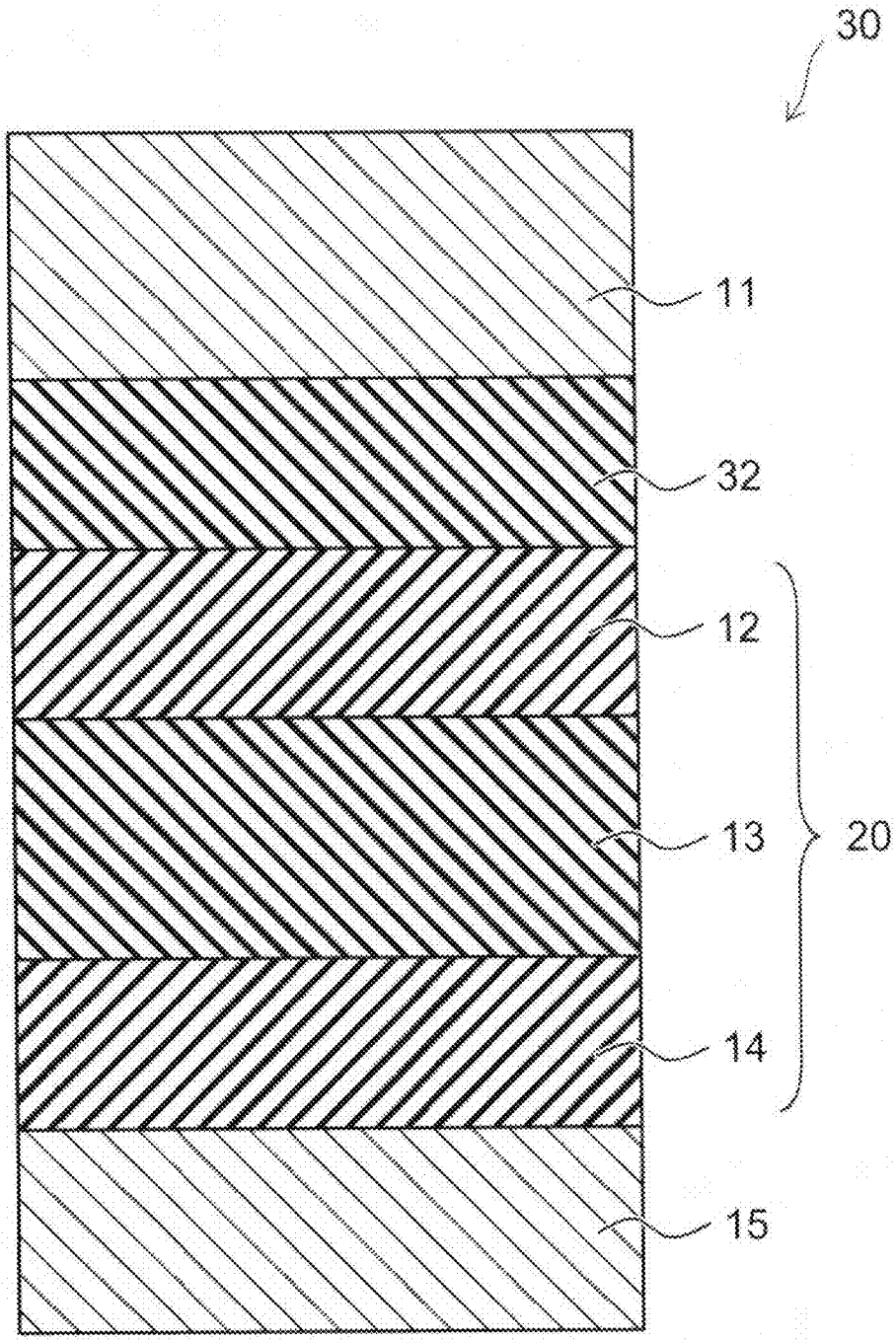
FIG. 7 is a sectional view illustrating a memory element of a resistance random access memory device according to a second embodiment.

FIG. 7 is a sectional view illustrating a memory element of a resistance random access memory device according to the embodiment.

As shown in FIG. 7, the memory element 30 of the resistance random access memory device according to the embodiment includes a nonmetal layer 32 in addition to the configuration of the memory element 10 (see FIG. 1) of the first embodiment described above. The nonmetal layer 32 is placed between the electrode 11 and the variable resistance portion 20, i.e., between the electrode 11 and the insulating layer 12.

The nonmetal layer 32 is a layer placed between the electrode 11 and the electrode 15 and having the following property. When a write voltage or read voltage of the forward voltage is applied, a filament is formed inside the layer, and the resistance value of the layer is decreased. Furthermore, the filament is decomposed more easily in the layer than in the variable resistance portion 20. Thus, the layer has lower retention performance in the low resistance state. The material of the nonmetal layer 32 can be based on e.g. one or more nonmetal materials selected from the group consisting of silicon, silicon oxide, germanium, germanium oxide, and metal oxide. Specific examples of metal oxide include hafnium oxide, aluminum oxide, titanium oxide, tantalum oxide, nickel oxide, tungsten oxide, and vanadium oxide.

Next, the operation of the resistance random access memory device according to the embodiment is described.

Figure 8A:
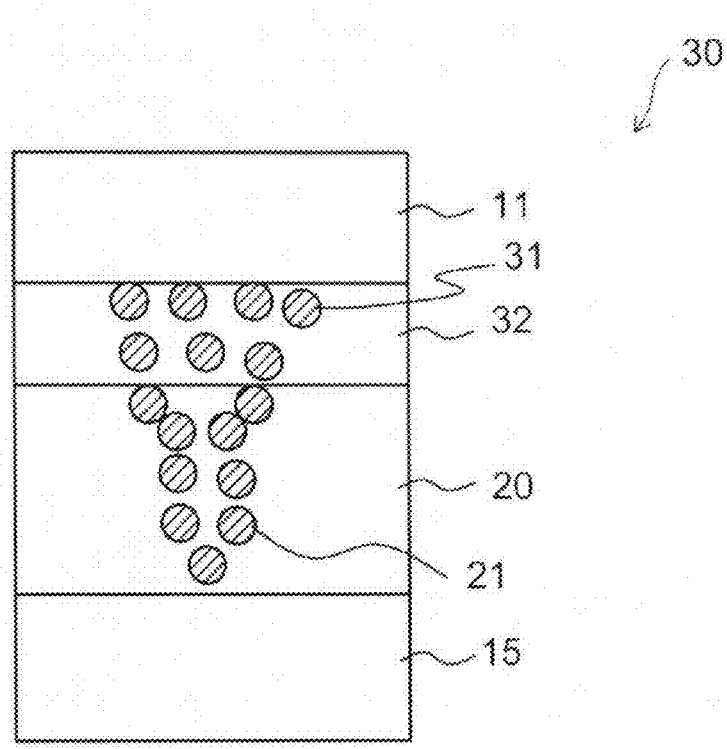
FIGS. 8A and 8B are schematic sectional views illustrating the operation of the resistance random access memory device according to the second embodiment.
Figure 8B:
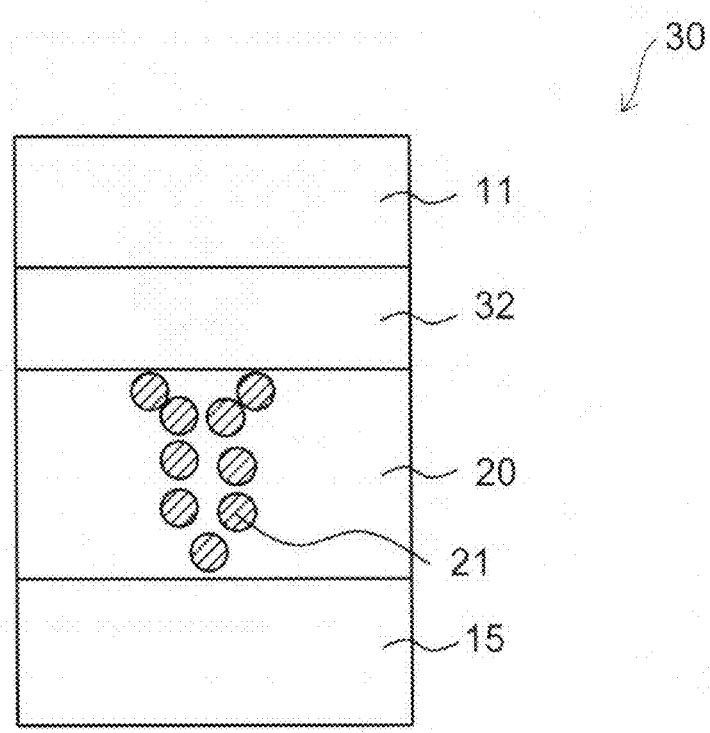

FIGS. 8A and 8B are schematic sectional views illustrating the operation of the resistance random access memory device according to the embodiment. FIG. 8A shows the device under application of a write voltage. FIG. 8B shows the device after turn-off of the write voltage.

In FIGS. 8A and 8B, metal atoms forming the filament are schematically depicted by hatched circles.

As shown in FIG. 8A, in the memory element 30 of the embodiment, when a write voltage is applied, a filament 21 is formed in the variable resistance portion 20. Furthermore, a filament 31 is formed also in the nonmetal layer 32. Thus, the device turns to the low resistance state.

Next, as shown in FIG. 8B, the write voltage is turned off. The filament 21 in the variable resistance portion 20 is tough, and hence is retained intact. However, the filament 31 in the nonmetal layer 32 is naturally decomposed. Thus, the nonmetal layer 32 spontaneously transitions to the high resistance state.

Then, at read time, a read voltage of the forward voltage is applied. Thus, a filament 31 is formed again in the nonmetal layer 32, and the nonmetal layer 32 turns to low resistance. In other words, the read voltage of the memory element 30 is set to a voltage capable of forming a filament 31 in the nonmetal layer 32. For instance, in the case where the electrode 11 is formed from silver, this requirement can be satisfied by forming the nonmetal layer 32 from amorphous silicon.

On the other hand, in the case where a reverse voltage is applied to the memory element 30, no filament 31 is formed in the nonmetal layer 32. Even for a forward voltage, in the case where a voltage lower than a prescribed voltage value is applied, again, no filament 31 is formed in the nonmetal layer 32. Thus, except when a prescribed read voltage is applied, the nonmetal layer 32 is kept in the high resistance state. Accordingly, sneak current in the array can be suppressed.

When an erase voltage is applied to the memory element 30, at least part of the filament 21 in the variable resistance portion 20 disappears, and the filament 31 in the nonmetal layer 32 also disappears. Thus, the variable resistance portion 20 and the nonmetal layer 32 both turn to the high resistance state.

Next, the effect of the embodiment is described.

As described above, according to the embodiment, in the case where the variable resistance portion 20 is in the low resistance state, by application of a read voltage being the forward voltage and sufficient for turning the nonmetal layer 32 to low resistance, the nonmetal layer 32 also turns to low resistance, and the entire memory element 30 turns to the low resistance state. On the other hand, in the case of applying a reverse voltage, or a forward voltage insufficient for turning the nonmetal layer 32 to low resistance, the nonmetal layer 32 does not turn to low resistance, and the memory element 30 does not entirely turn to the low resistance state. Thus, a rectifying function can be imparted to the memory element 30.

The configuration, operation, and effect of the embodiment other than the foregoing are similar to those of the above first embodiment.

(Third Embodiment)

Next, a third embodiment is described.

Figure 9:
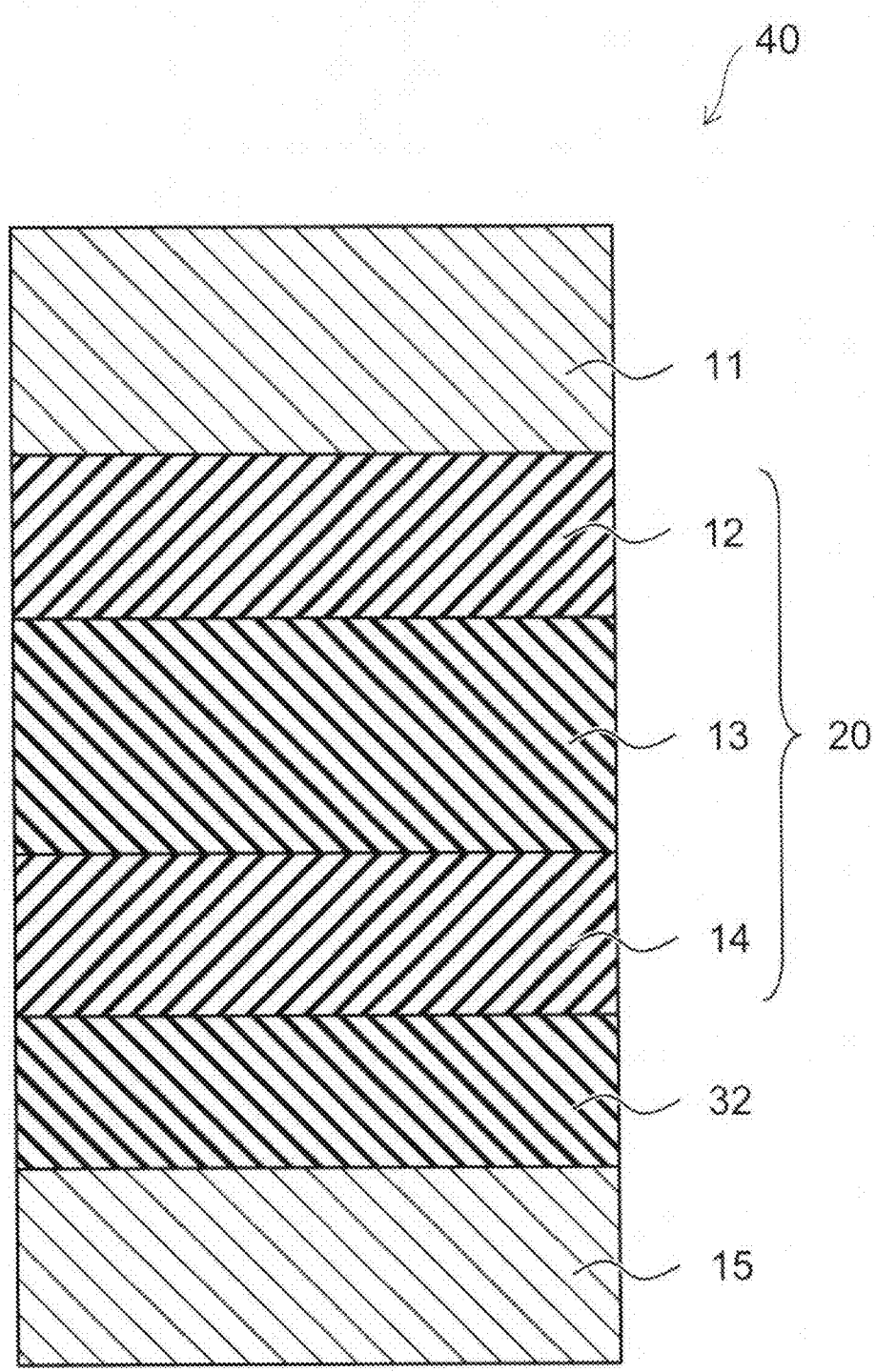
FIG. 9 is a sectional view illustrating a memory element of a resistance random access memory device according to a third embodiment.

FIG. 9 is a sectional view illustrating a memory element of a resistance random access memory device according to the embodiment.

As shown in FIG. 9, the memory element 40 of the resistance random access memory device according to the embodiment is different from the aforementioned memory element 30 (see FIG. 7) of the second embodiment in that the nonmetal layer 32 is placed between the electrode 15 and the variable resistance portion 20, i.e., between the electrode 15 and the insulating layer 14.

Also according to the embodiment, as in the above second embodiment, a rectifying function can be imparted to the memory element 40. That is, the nonmetal layer 32 can be placed at any position between the electrode 11 and the electrode 15 such that a filament is formed from cations of metal atoms constituting the electrode 11 when a prescribed read voltage is applied.

The configuration, operation, and effect of the embodiment other than the foregoing are similar to those of the above second embodiment.

(Fourth Embodiment)

Next, a fourth embodiment is described.

Figure 10:
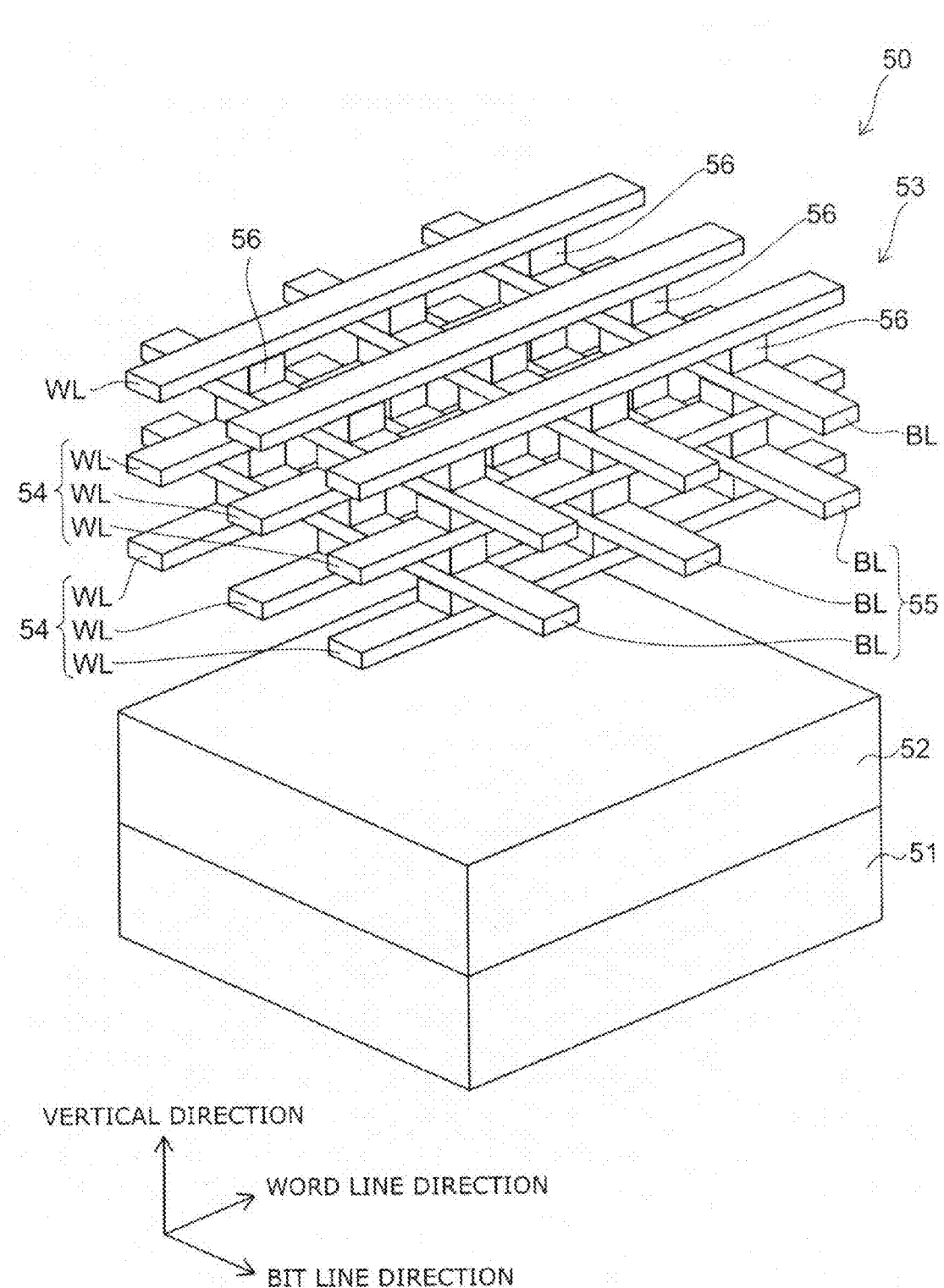
FIG. 10 is a perspective view illustrating a resistance random access memory device according to a fourth embodiment.

FIG. 10 is a perspective view illustrating a resistance random access memory device according to the embodiment.

Figure 11:
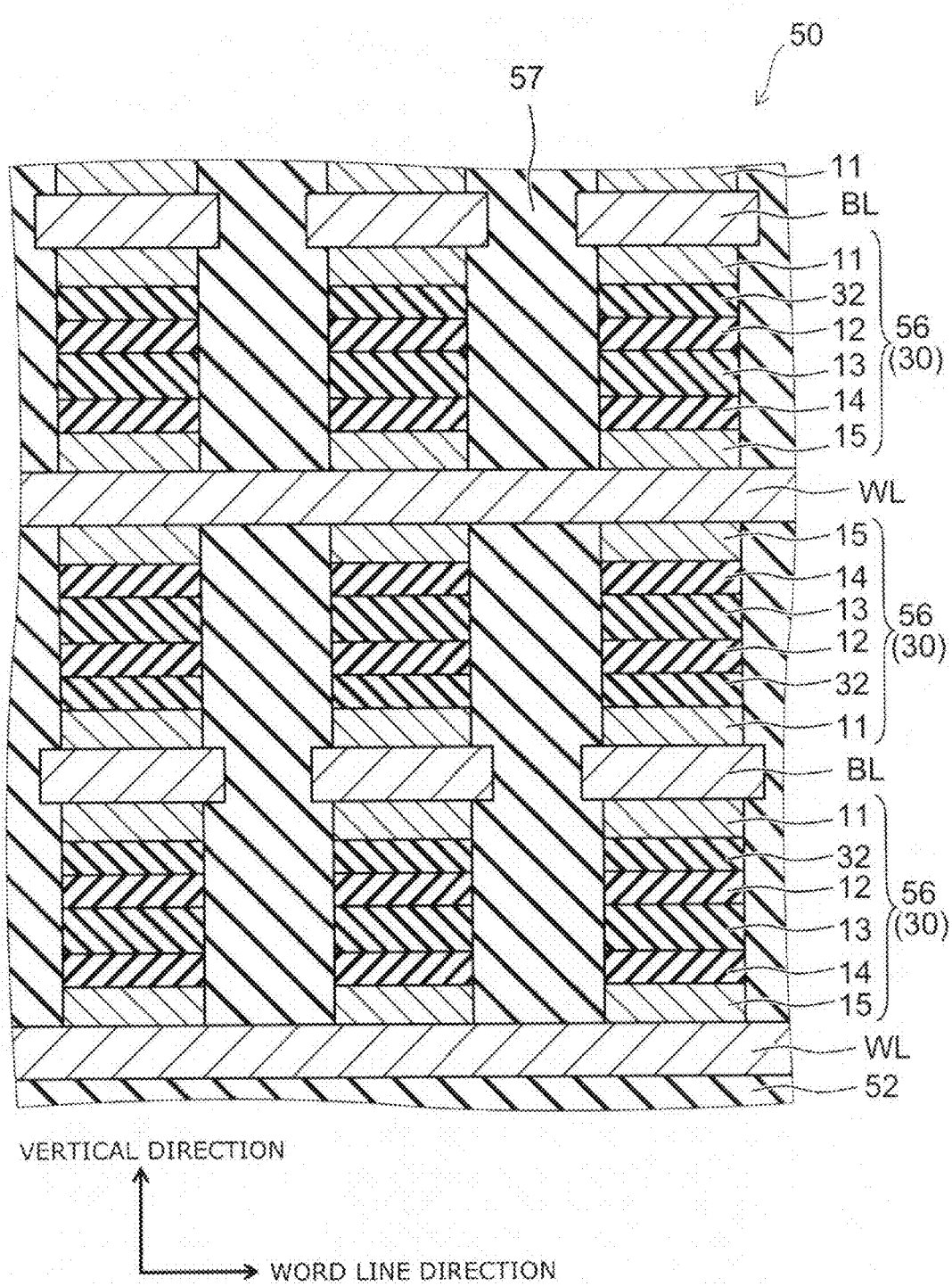
FIG. 11 is a sectional view illustrating the resistance random access memory device according to the fourth embodiment.

FIG. 11 is a sectional view illustrating the resistance random access memory device according to the embodiment.

As shown in FIG. 10, the memory device 50 according to the embodiment includes a silicon substrate 51. A driver circuit (not shown) for the memory device 50 is formed in an upper portion and on the upper surface of the silicon substrate 51. An interlayer insulating film 52 made of e.g. silicon oxide is provided on the silicon substrate 51 so as to embed the driver circuit. A memory cell section 53 is provided on the interlayer insulating film 52.

In the memory cell section 53, word line wiring layers 54 and bit line wiring layers 55 are alternately stacked. The word line wiring layer 54 includes a plurality of word lines WL extending in one direction (hereinafter referred to as "word line direction") parallel to the upper surface of the silicon substrate 51. The bit line wiring layer 55 includes a plurality of bit lines BL extending in a direction (hereinafter referred to as "bit line direction") being parallel to the upper surface of the silicon substrate 51 and crossing, such as being orthogonal to, the word line direction. The adjacent word lines W, the adjacent bit lines BL, and the word line WL and the bit line BL are not in contact with each other.

At the closest point of each word line WL and each bit line BL, a pillar 56 extending in the direction (hereinafter referred to as "vertical direction") perpendicular to the upper surface of the silicon substrate 51 is provided. The pillar 56 is shaped like e.g. a cylinder, a quadrangular prism, or a generally quadrangular prism with rounded corners. The pillar 56 is formed between the word line WL and the bit line BL. One pillar 56 constitutes one memory element 30. That is, the memory device 50 is a cross-point device in which a memory element 30 is placed at each closest point of the word line WL and the bit line BL. An interlayer insulating film 57 (see FIG. 11) is embedded among the word lines WL, the bit lines BL, and the pillars 56.

As shown in FIG. 11, the memory element 30 has the same configuration as the memory element 30 (see FIG. 7) in the above second embodiment. The electrode 11 of each memory element 30 is connected to a bit line BL, and the electrode 15 is connected to a word line WL. Thus, the resistance random access memory device 50 includes pillars 56 with a word line WL placed therebelow and a bit line BL placed thereabove, and pillars 56 with a bit line BL placed therebelow and a word line WL placed thereabove. These pillars 56 have opposite stacking directions as viewed from the silicon substrate 51. In other words, in any of the pillars 56, from a bit line BL toward a word line WL, an electrode 11, a nonmetal layer 32, an insulating layer 12, a crystal layer 13, an insulating layer 14, and an electrode 15 are stacked in this order.

In FIG. 10, the cross-point device including pillars 56 is shown. However, the element does not need to be shaped like a pillar. The variable resistance portion 20 may be provided between the word line wiring layer 54 and the bit line wiring layer 55.

Next, the operation of the embodiment is described.

In a cross-point device like the resistance random access memory device 50 according to the embodiment, one memory element 30 is selected by selecting one bit line BL and one word line WL. That is, one bit line is selected and applied with potential V. One word line WL is selected and applied with potential 0. The other bit lines BL and the other word lines WL are applied with potential V/2. Then, voltage V is applied to one memory element 30 connected between the selected bit line BL and the selected word line WL. Thus, the read operation is performed.

At this time, no voltage is applied to the memory element 30 connected between the non-selected bit line BL and the non-selected word line WL. However, voltage V/2 is applied to the memory element 30 connected between the selected bit line BL and the non-selected word line WL, and the memory element 30 connected between the non-selected bit line BL and the selected word line WL. This application of voltage V/2 causes sneak current to flow.

Thus, in the embodiment, the nonmetal layer 32 is provided in each memory element 30 to impart a rectifying function to the memory element 30. Accordingly, in the case where the memory element 30 is in the low resistance state, a prescribed current flows by applying a prescribed read voltage. However, the prescribed current does not flow even if a reverse voltage, or a forward voltage less than a prescribed value, is applied. As a result, in selecting one memory element 30, occurrence of malfunctions in the other memory elements 30 can be prevented.

Next, the effect of the embodiment is described.

According to the embodiment, the nonmetal layer 32 is provided in each memory element 30 to impart a rectifying function. Thus, a cross-point device can be constructed from only the memory elements without providing rectifying elements independently of the memory elements 30. This can realize a resistance random access memory device having a simple configuration, being easy to manufacture, and having high memory density.

(Fifth Embodiment)

Next, a fifth embodiment is described.

Figure 12:
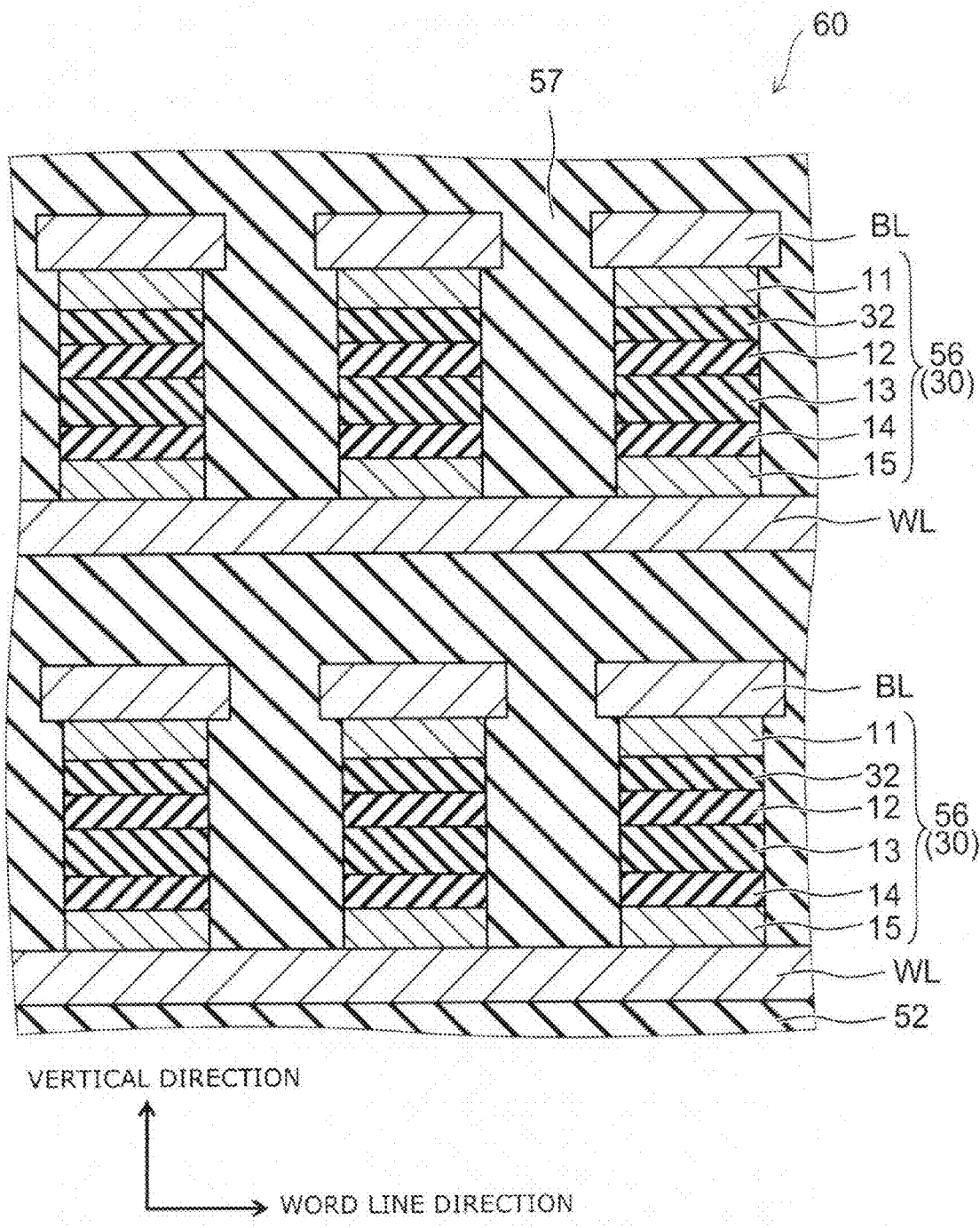
FIG. 12 is a sectional view illustrating a resistance random access memory device according to a fifth embodiment.

FIG. 12 is a sectional view illustrating a resistance random access memory device according to the embodiment.

As shown in FIG. 12, in the resistance random access memory device 60 according to the embodiment, a plurality of pairs each made of one word line wiring layer 54 and one bit line wiring layer 55 are stacked. At a position with a word line WL placed therebelow and a bit line BL placed thereabove, a pillar 56 is provided. However, at a position with a bit line BL placed therebelow and a word line WL placed thereabove, no pillar 56 is provided. Thus, in all the pillars 56, the stacking direction as viewed from the silicon substrate 51 is identical.

In the embodiment, the stacking order of all the pillars 56 can be made identical. This simplifies the manufacturing process. The configuration, operation, and effect of the embodiment other than the foregoing are similar to those of the above fourth embodiment.

In the examples illustrated in the fourth and fifth embodiments described above, the memory element 30 is formed in the pillar 56. However, instead of the memory element 30, the memory element 40 (see FIG. 9) described above in the third embodiment may be formed.

In the fourth and fifth embodiments described above, the electrode 11 and the bit line BL may be made common, and the electrode 15 and the word line WL may be made common.

Furthermore, in the resistance random access memory device according to the fourth and fifth embodiments described above, a compliance circuit for limiting the current flowing in each memory element may be provided. This can prevent destruction of the memory element due to flow of excessive current in the memory element. In this case, the upper limit value of the write current flowing in each memory element is set to e.g. 10-100 nA (nanoamperes).

(Sixth Embodiment)

Next, a sixth embodiment is described.

Figure 13:
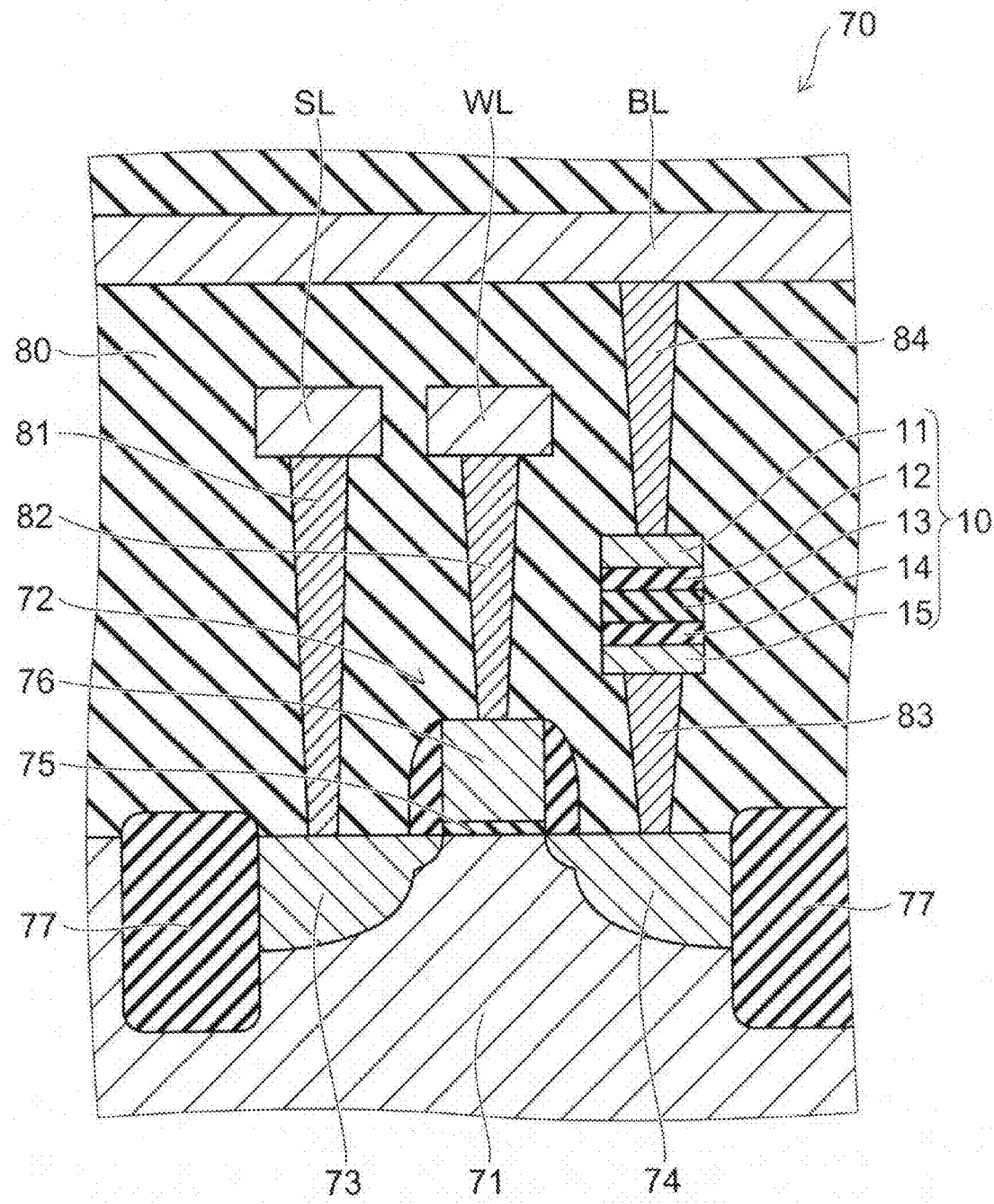
FIG. 13 is a sectional view illustrating a resistance random access memory device according to a sixth embodiment.

FIG. 13 is a sectional view illustrating a resistance random access memory device according to the embodiment.

As shown in FIG. 13, the resistance random access memory device 70 according to the embodiment is a 1T1R type device. In the resistance random access memory device 70, a field effect transistor 72 is formed on the upper surface of a silicon substrate 71. In the transistor 72, a source layer 73 and a drain layer 74 are formed and spaced from each other in a region partitioned by STI (shallow trench isolation) 77 in the upper portion of the silicon substrate 71. A gate insulating film is provided immediately above the region between the source layer 73 and the drain layer 74 on the silicon substrate 71. A gate electrode 76 is provided on the gate insulating film 75.

Furthermore, an interlayer insulating film 80 is provided on the silicon substrate 71. In the interlayer insulating film 80, a memory element 10, a source line SL, a word line WL, and a bit line BL are provided. The source layer 73 is connected to the source line SL through a contact 81. The gate electrode 76 is connected to the word line WL through a contact 82. The drain layer 74 is connected to the electrode 15 of the memory element 10 through a contact 83. The electrode 11 of the memory element 10 is connected to the bit line BL through a via 84.

The embodiment can realize a 1T1R type memory device.

The configuration, operation, and effect of the embodiment other than the foregoing are similar to those of the above first embodiment.

In the embodiment, the electrode 11 and the via 84 may be made common, and the electrode 15 and the contact 83 may be made common.

The embodiments described above can realize a resistance random access memory device having high retention performance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A resistance random access memory device comprising:
a first electrode;
a second electrode; and
a variable resistance portion placed between the first electrode and the second electrode,
the variable resistance portion including:
a first insulating layer;
a second insulating layer; and
a crystal layer placed between the first insulating layer and the second insulating layer, having a higher resistivity than the first electrode, and being crystalline.

2. The device according to claim 1, wherein the crystal layer includes one or more materials selected from the group consisting of crystalline silicon, crystalline germanium, and crystalline silicon germanium.

3. The device according to claim 1, wherein the first electrode includes one or more metal materials selected from the group consisting of silver, copper, nickel, cobalt, titanium, aluminum, and gold.

4. The device according to claim 1, wherein at least one of the first insulating layer and the second insulating layer includes one or more insulating materials selected from the group consisting of silicon oxide, silicon nitride, silicon oxynitride, and metal oxide.

5. The device according to claim 1, wherein the first insulating layer and the second insulating layer are each thinner than the crystal layer.

6. The device according to claim 1, wherein thickness of the first insulating layer and thickness of the second insulating layer are each 5 nm or less.

7. The device according to claim 1, wherein in the crystal layer, at least one crystal face continuously exists between an interface with the first insulating layer and an interface with the second insulating layer.

8. The device according to claim 7, wherein the crystal layer is made of silicon, and the crystal face is a (111) face of silicon.

9. The device according to claim 1, wherein in the crystal layer, at least one crystal grain boundary continuously exists between an interface with the first insulating layer and an interface with the second insulating layer.

10. The device according to claim 1, further comprising:
a bit line connected to one of the first electrode and the second electrode;
a transistor with one of a source and a drain thereof connected to the other of the first electrode and the second electrode;
a source line connected with the other of the source and the drain of the transistor; and
a word line connected to a gate of the transistor.

11. A resistance random access memory device comprising:
a first electrode;
a second electrode;
a variable resistance portion placed between the first electrode and the second electrode; and
a nonmetal layer provided between the first electrode and the variable resistance portion or between the second electrode and the variable resistance portion,
the variable resistance portion including:
a first insulating layer;
a second insulating layer; and
a crystal layer placed between the first insulating layer and the second insulating layer, having a higher resistivity than the first electrode, and being crystalline.

12. The device according to claim 11, wherein
the nonmetal layer turns to a low resistance state when a voltage is applied between the first electrode and the second electrode so that the variable resistance portion turns to a low resistance state, and
retention performance of the low resistance state of the nonmetal layer is lower than retention performance of the low resistance state of the variable resistance portion.

13. The device according to claim 11, wherein the nonmetal layer includes one or more materials selected from the group consisting of silicon, silicon oxide, germanium, germanium oxide, and metal oxide.

14. The device according to claim 11, further comprising:
a word line wiring layer including a plurality of word lines extending in a first direction; and
a bit line wiring layer including a plurality of bit lines extending in a second direction crossing the first direction,
wherein the word line wiring layer and the bit line wiring layer are alternately stacked, and
a pillar including the first electrode, the second electrode, and the variable resistance portion is placed between each of the word lines and each of the bit lines.

15. A resistance random access memory device comprising:
a first electrode including silver;
a second electrode; and
a variable resistance portion placed between the first electrode and the second electrode,
the variable resistance portion including:
a first silicon oxide layer;
a second silicon oxide layer; and
a crystalline silicon layer placed between the first silicon oxide layer and the second silicon oxide layer.

16. The device according to claim 15, further comprising:
at least one of an amorphous silicon layer or a silicon oxide layer provided between the first electrode and the variable resistance portion.

17. The device according to claim 15, further comprising:
at least one of an amorphous silicon layer or a silicon oxide layer provided between the second electrode and the variable resistance portion.

18. The device according to claim 15, further comprising:
a word line wiring layer including a plurality of word lines extending in a first direction; and
a bit line wiring layer including a plurality of bit lines extending in a second direction crossing the first direction,
wherein the first electrode, the second electrode, and the variable resistance portion are placed between each of the word lines and each of the bit lines.

* * * * *